(12) United States Patent
Bannon et al.

(10) Patent No.: US 9,078,375 B1
(45) Date of Patent: Jul. 7, 2015

(54) HARDWARE PLANE PROVIDING IMPROVED COOLING AIR FLOW

(75) Inventors: Roy Michael Bannon, Palo Alto, CA (US); Scott McCauley, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 192 days.

(21) Appl. No.: 13/532,261

(22) Filed: Jun. 25, 2012

(51) Int. Cl.
*H05K 1/14* (2006.01)
*H05K 7/20* (2006.01)

(52) U.S. Cl.
CPC .......................................... *H05K 7/20* (2013.01)

(58) Field of Classification Search
USPC ........................ 361/676–678, 679.46–679.54, 361/688–722, 752, 760, 831, 747–748, 361/784–788, 802, 807–811
See application file for complete search history.

(56) References Cited

U.S. PATENT DOCUMENTS

| | | | |
|---|---|---|---|
| 8,208,253 B1* | 6/2012 | Goergen et al. | 361/679.5 |
| 2005/0207134 A1* | 9/2005 | Belady et al. | 361/796 |
| 2006/0126292 A1* | 6/2006 | Pfahnl et al. | 361/695 |
| 2008/0046617 A1* | 2/2008 | Lee et al. | 710/104 |
| 2008/0225474 A1* | 9/2008 | Flynn et al. | 361/683 |
| 2009/0109610 A1* | 4/2009 | Hirai et al. | 361/679.46 |
| 2011/0228779 A1* | 9/2011 | Goergen | 370/392 |

* cited by examiner

*Primary Examiner* — Courtney Smith
(74) *Attorney, Agent, or Firm* — Edward A. Gordon; Foley & Lardner

(57) ABSTRACT

A hardware plane providing improved cooling air flow is disclosed herein. The hardware plane includes one or more minor planes extending from a major plane so that a gap or opening is formed for air flow. A cooling unit moves air through the gap and across the surface of hardware cards connected to the hardware plane in order to cool the hardware plane and the hardware cards. The hardware plane allows for both improved cooling air flow and for space-efficient and cost-efficient positioning of hardware cards, data buses, and control buses.

14 Claims, 10 Drawing Sheets

HARDWARE PLANE PROVIDING IMPROVED COOLING AIR FLOW

BACKGROUND

This disclosure generally relates to providing improved cooling air flow.

Some computer systems, such as blade-based servers, routers, and switches, include a number of hardware cards connected to a hardware plane backbone. The hardware plane is a backplane or midplane typically implemented as a printed circuit board (PCB) with various connectors and components for interconnecting hardware cards to allow for data transfer. A hardware plane may be part of an electronics chassis located in a server rack or a computer case. The hardware cards provide various functionality to the computer systems, such as additional processing, graphics processing, network connectivity, or resource management. During operation of the computer system, the hardware plane and the hardware cards may generate a significant amount of heat. This heat may significantly increase the rate of processor errors and/or equipment failures. A common solution for reducing the generated heat is to use fans to move cooling air around the hardware plane and the hardware cards.

Unfortunately, many existing hardware plane designs prevent efficient air flow around the interconnected hardware plane and hardware cards. For example, existing backplanes have connectors mounted on one major surface of the backplane, with each hardware card connecting to the backplane by an edge orthogonally to one surface of the backplane. Similarly, existing midplanes have connectors mounted on two continuous surfaces with hardware cards connecting orthogonally to either of the two major surfaces of the midplane. Typically, fans may be positioned to direct air orthogonally towards either of the two major surfaces of a hardware plane (i.e. "front to back" or "back to front"). Alternatively, fans may also be positioned to direct air across either of the two major surfaces of the hardware plane (i.e. "side to side"). If a fan is positioned "front to back" or "back to front," then the air flow is physically impeded by the surface of the hardware plane itself and thus provides less effective cooling. Positioning a fan "side to side" would improve the air flow, but extra lateral space inside the computer system would have to be provided to accommodate the fan.

An additional consideration involved in designing a hardware plane that improves air flow around the hardware plane is determining where to position the data buses, control buses, and connectors on the surface of the hardware plane. Often, at least two types of hardware cards, such as line cards and processor cards, are connected to a hardware plane. Line cards generally connect the hardware plane to one or more telecommunications networks, and processor cards generally send commands to control the line cards and process data received from the line cards. Multiple line cards are connected to the same data bus so that any line card connected to the bus can communicate with any other line card connected to the bus. In addition, each processor card and each line card is connected to the same control bus so that any processor card can communicate with any other processor card, and so that any processor card may send commands to, and receive data from, any line card. Because data and control buses are typically implemented as electrically conducting wires, a hardware engineer carefully plans the layout data and control buses on a hardware plane so that the wires do not physically touch each other. If there is a location on the surface of the hardware plane where two wires would intersect, the hardware engineer can add a physical layer to the hardware plane between the wires so that the wires do not intersect. A location where two wires are prevented from intersecting by a physical layer will be referred to as a wire overlap site. Unfortunately, adding layers to a hardware plane creates a thicker, more complicated, and more expensive hardware plane. Accordingly, it is important to carefully position data buses, control buses, and hardware card connectors on a hardware plane to limit the number of wire overlap sites while allowing the hardware plane to accommodate as many hardware cards as possible.

SUMMARY

Thus, a hardware plane design is provided that improves cooling air flow around the hardware plane while having space-efficient and cost-efficient positioning of hardware cards and buses. The present disclosure provides a hardware plane with a gap or opening that provides for improved air flow while limiting wire overlap sites without compromising the ability to interconnect many hardware cards in a space-efficient way.

According to one aspect, the present disclosure relates to a hardware plane providing improved airflow. The hardware plane includes a substantially rectangular major plane including a control bus configured to communicate with a plurality of hardware cards. The hardware plane also includes a first substantially rectangular minor plane extending from a first edge of the major plane, the first minor plane including a data bus configured to communicate with the plurality of hardware cards. The hardware plane also includes a first connector positioned on a first surface of the plane, the first connector configured to connect a first hardware card of the plurality of hardware cards orthogonally to the first surface of the plane.

In some embodiments, the hardware plane also includes a second substantially rectangular minor plane extending from the first edge of the major plane wherein a gap separates the first minor plane and the second minor plane. In some embodiments, the major plane, the first minor plane, and the second minor plane are substantially coplanar. In some embodiments, the hardware plane includes a second connector positioned on the first surface of the plane, the second connector configured to connect a second hardware card of a plurality of hardware cards orthogonally to the first surface of the plane. In some embodiments, a system includes the hardware plane and a cooling device configured to produce air flowing substantially orthogonally to the first surface of the plane through the gap and across the plurality of hardware cards. In some embodiments, the first hardware card and the second hardware card each include a first surface having hardware components. When the first hardware card and the second hardware card are each connected to the plane, the first surface of the first hardware card faces a direction opposite to the first surface of the second hardware card. In some embodiments, the first connector is positioned on the first minor plane, the first connector configured to connect the first hardware card orthogonally to the first minor plane, and the second connector is positioned on the major plane, the second connector configured to connect the second hardware card orthogonally to the major plane.

In some embodiments, the first hardware card is a line card connected to the data bus and the control bus, the line card configured to provide access to a telecommunications network. In some embodiments, the second hardware card is a processor card connected to the control bus, the processor card comprising a processor configured to process data received from the plurality of hardware cards and control the behavior of the plurality of hardware cards. In some embodiments, the second hardware card is a resource management card connected to the control bus, the resource management card configured to manage access to a shared resource by the plurality of hardware cards.

According to one aspect, the present disclosure relates to a hardware plane, providing improved airflow. The hardware plane includes a substantially rectangular major plane comprising one or more openings configured to allow air to pass through substantially orthogonally to a first surface of the major plane. The hardware plane also includes a control bus positioned along the first surface of the major plane, the control bus configured to communicate with a plurality of hardware cards. The hardware plane also includes a data bus positioned along the first surface of the major plane, the data bus configured to communicate with a plurality of hardware cards. The hardware plane also includes a connector positioned on the first surface of the major plane, the connector configured to connect a first hardware card of the plurality of hardware cards orthogonally to the first surface of the major plane.

BRIEF DESCRIPTION OF THE DRAWINGS

Further features of the present disclosure, its nature and various advantages, will be apparent upon consideration of the following detailed description, taken in conjunction with the accompanying drawings, in which like reference characters refer to like parts throughout, and in which.

DESCRIPTION OF CERTAIN ILLUSTRATIVE IMPLEMENTATIONS

To provide an overall understanding of the present disclosure, certain illustrative implementations will now be described, including a hardware plane providing improved cooling air flow. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope thereof.

System Description

Figure 1A:
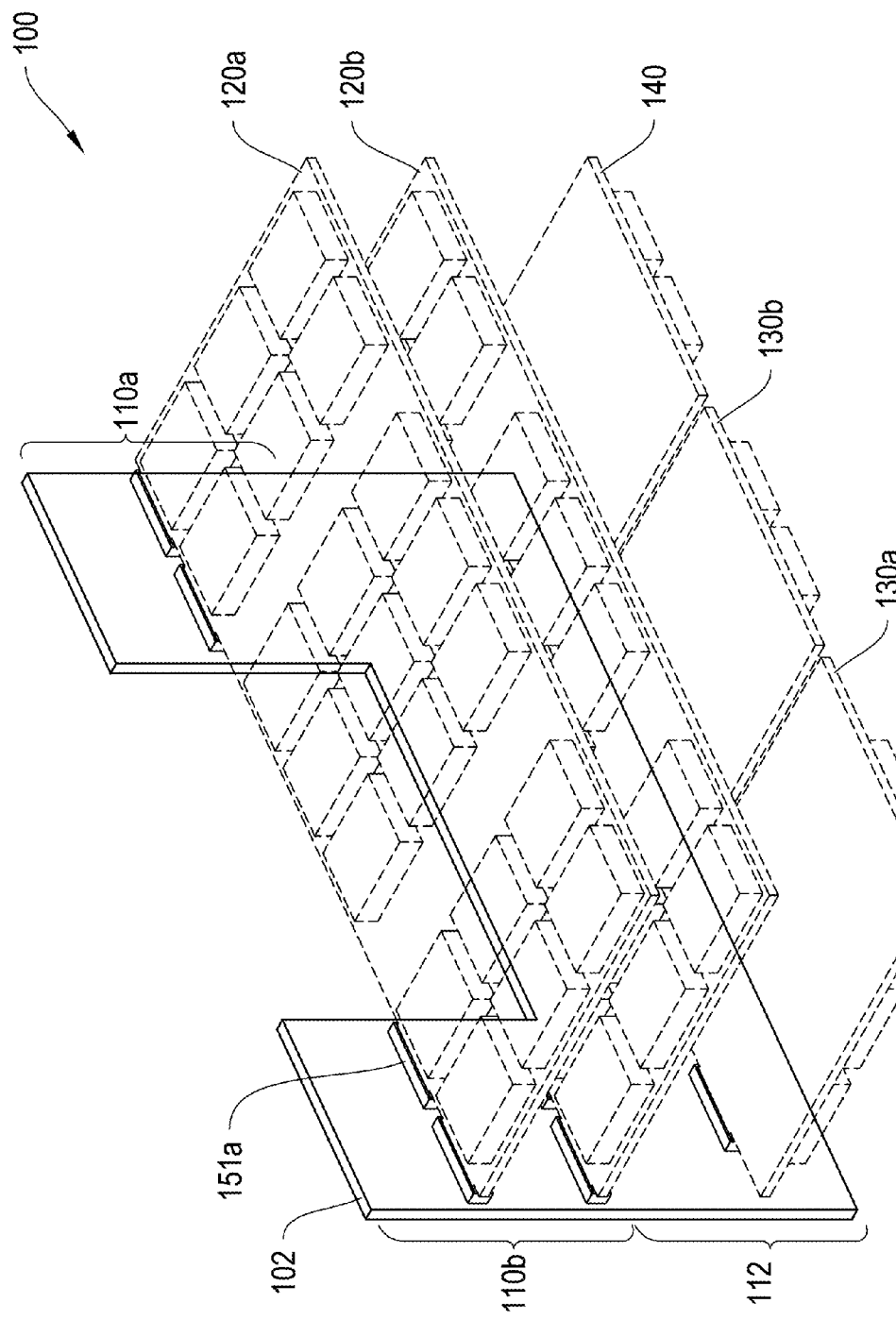
FIG. 1A is an isometric view of an illustrative hardware plane in accordance with some implementations of the present disclosure.
Figure 1B:
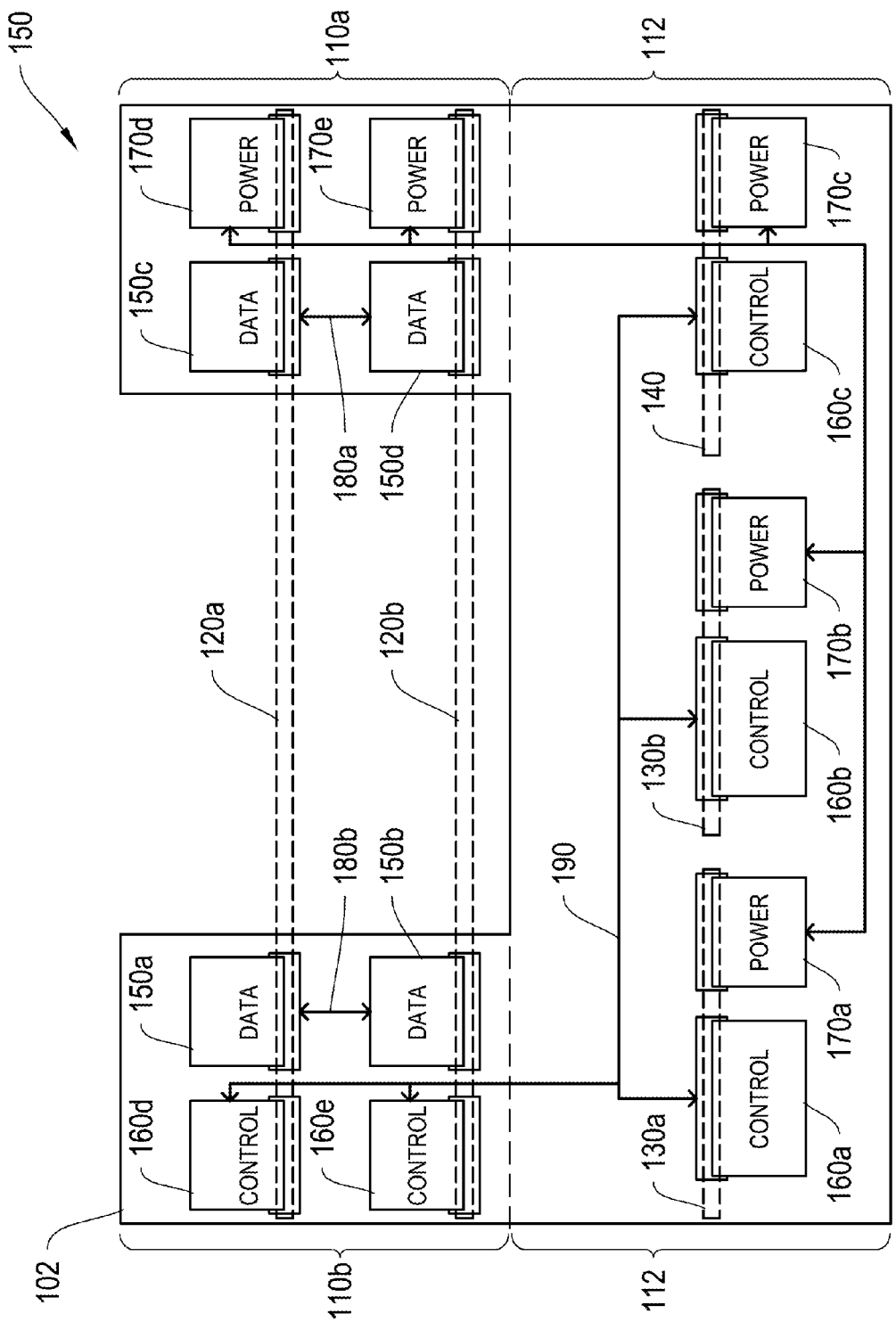
FIG. 1B is a side view of the hardware plane of FIG. 1A in accordance with some implementations of the present disclosure.

FIG. 1A is an isometric view of an illustrative hardware plane in accordance with some implementations of the present disclosure. FIG. 1B is a side view of the hardware plane of FIG. 1A in accordance with some implementations of the present disclosure. A system 100 includes a hardware plane 102 and various hardware cards connected to the hardware plane 102, such as line cards 120a and 120b; processor cards 130a and 130b; and a resource management card 140. The hardware plane 102 includes minor planes 110a and 110b and a major plane 112 (also called a base), which is a bottom portion of the hardware plane. As seen in FIG. 1B, the minor planes 110a and 110b extend substantially orthogonally from an edge of the major plane 112 so that the major plane 112 and the minor planes 110a and 110b are substantially coplanar. For example, in one implementation, the major plane 112 and the minor planes 110a and 110b form a single "U" shaped plane, as shown in FIG. 1B, where the minor planes 110a and 110b are coplanar with the major plane 112, and the minor planes 110a and 110b form the "legs" of the "U." The hardware plane 102 may be any type of printed circuit board (PCB) or other suitable device used to interconnect various hardware cards to form the system 100. The major plane 112 and the minor planes 110a and 110b may be segments of a single PCB or separate PCBs or other suitable devices for interconnecting various hardware cards. The system 100 may be any type of computer system, such as a server (i.e. blade server), router, or a network switch. The hardware plane 102 may form the backbone of the system 100.

Although FIGS. 1A and 1B show that the hardware plane 102 has two minor planes (i.e. minor planes 110a and 110b) extending orthogonally from an edge of the major plane 112, the hardware plane 102 shown in FIGS. 1A and 1B is provided only as an example. In other implementations for example, the minor planes 110a and 110b may be closer or farther apart than as depicted in FIGS. 1A and 1B. In some implementations, the minor planes 110a and 110b are not substantially parallel to each other. The major plane 112 may be substantially rectangular or any other shape. Similarly, the minor planes 110a and 110b may also be substantially rectangular or any other shape. In some implementations, the hardware plane 102 may not include any minor planes, as shown in FIGS. 4A-4F. In some implementations, instead of the hardware plane 102 being substantially coplanar with the minor planes 110a and 110b, the surfaces of the minor planes 110a and 110b may be at an angle relative to the surface of the hardware plane 102. As discussed further below, many other geometric configurations are possible.

As seen in FIG. 1B, the hardware plane 102 includes a gap between the minor planes 110a and 110b. The line cards 120a and 120b span the gap between the minor planes 110a and 110b. Spanning the gap between the minor planes 110a and 110b means to extend across the empty space formed between the minor plane 110a and the minor plane 110b. As shown in FIG. 1B, the major plane 112 also spans the gap between the minor planes 110a and 110b. In some implementations, the major plane 112 may span a portion of the gap between the minor planes 110a and 110b. As discussed further below, the gap may provide improved airflow resulting in more efficient cooling for the system 100.

As mentioned above, various hardware cards, such as line cards 120a and 120b; processor cards 130a and 130b; and a resource management card 140, may connect to the hardware plane 102. The hardware cards connect substantially orthogonally to a surface of the hardware plane 102. For example, FIGS. 1A and 1B show the hardware cards connected to a surface of the hardware plane 102. The hardware cards may be PCBs or any suitable electronic circuit device for adding functionality to a computer system of which the hardware plane 102 and the hardware cards are parts.

The line cards 120a and 120b are electronic circuit devices that connect the system 100 to one or more telecommunications networks. For example, the line cards 120a and 120b may be modular Ethernet or telephone cards.

The processor cards 130a and 130b are electronic circuit devices containing one or more processors and/or co-processors that provide primary and/or supplementary processing functions for the system 100. For example, the processor cards 130a and 130b may provide supplemental graphical processing or digital signal processing functions to the system 100. The processor cards 130a and 130b may include power supplies.

The resource management card 140 is an electronic circuit device that monitors and manages access to shared resources by various parts of the system 100, such as the hardware plane 102 or any hardware cards connected to the hardware plane 102. Examples of shared resources include electrical power, visual displays, cooling, etc. For example, as shown in FIG. 1B, the resource management card 140 may be a device that manages the electrical power consumption of the hardware cards connected to the hardware plane 102. In other implementations, the resource management card 140 may be a device that renders data received from the hardware cards to a visual display for presenting a user with information about the status of the system 100. The resource management card 140 may also be a device that controls the operation of a cooling fan or other unit that affects other environmental conditions of the system 100.

The hardware plane 102 also includes various connectors, such as data connectors 150a, 150b, 150c, and 150d (collectively "data connectors 150"); control connectors 160a, 160b, 160c, 160d, and 160e (collectively "control connectors 160"); and resource management connectors 170a, 170b, 170c, 170d, and 170e (collectively "resource management connectors 170"). Each of these connectors allows for data and/or power transfer between a hardware card and the hardware plane 102. For example, a connector may include a group of pins for carrying data signals and a plastic housing for containing the pins and physically holding a portion of a hardware card in place. A hardware card connects orthogonally to a surface of the hardware plane 102 via one or more connectors. For example, data connector 150a connects a portion of the line card 120a to the hardware plane 102. The line card 120a is connected orthogonally to the surface of the hardware plane 102 where the data connector 150a is positioned. In some implementations, the connectors are surface-mounted on the hardware plane 102.

The data connectors 150 connect to one or more data buses (i.e. data buses 180a and 180b) along the surface of the hardware plane 102, i.e. along the minor plane 110a and/or the minor plane 110b. The data buses 180a and 180b may utilize any known signaling medium, such as a copper or fiber optic medium. For example, the data buses 180a and 180b may include one or more electrically conducting pathways etched or printed onto the surface of the hardware plane 102. The data buses 180a and 180b allow data transfer between hardware cards connected to one or more of the data connectors 150. In FIG. 1B, the data connectors 150a and 150b connect to the data bus 180b along the minor plane 110b. Similarly, the data connectors 150c and 150d connect to the data bus 180a along the minor plane 110a. As shown in FIG. 1B, the line card 120a is connected to data connectors 150a and 150c, and the line card 120b is connected to data connectors 150b and 150d. Thus, the data buses 180a and 180b allow for data transfer between the line card 120a and the line card 120b along the minor planes 110a and 110b. The data buses 180a and 180b may use any suitable communications protocol, such as backplane Ethernet (i.e. IEEE 802.3ap), for data transfer.

The control connectors 160 connect to one or more control buses (i.e. control bus 190) across the surface of the hardware plane 102. The control bus 190 may utilize any known signaling medium, such as a copper or fiber optic medium. For example, the control buses may include one or more electrically conducting pathways etched or printed onto the surface of the hardware plane 102. The control buses are configured to allow processors on the processor cards 130a and 130b to communicate with the other hardware cards connected to the hardware plane 102. In FIG. 1B, the processor card 130a is connected to the control connector 160a; the processor card 130b is connected to the control connector 160b; the resource management card 140 is connected to the control connector 160c; the line card 120a is connected to the control connector 160d; and the line card 120b is connected to the control connector 160e. The processor cards 130a and 130b may send commands to, and receive data from, the line cards 120a and 120b and the resource management card 140 via the control bus 190. The control bus 190 may use any suitable communications and control protocol, such as the Peripheral Component Interconnect Express bus standard ("PCIe").

Typically, control connectors for processor cards, such as the control connectors 160a and 160b, may be physically larger than the data connectors 150. Thus, the processor cards 130a and 130b may connect to the wider major plane 112 rather than the thinner minor planes 110a or 110b in order to accommodate the larger control connectors 160a and 160b.

By positioning the data buses 180a and 180b and the control bus 190 around the gap as shown in FIG. 1B, the hardware plane 102 achieves a simple bus layout that minimizes the number of wire overlap sites on the surface of the hardware plane 102. At the same time, the design of the hardware plane 102 efficiently spaces out the hardware cards connected to the hardware plane 102.

The resource management card 140 connects to the resource management connectors 170. The resource management card 140 sends commands via the resource management connectors 170 to manage the access to a shared resource, such as electrical power, by various parts of the system 100, such as the hardware plane 102 or any hardware cards connected to the hardware plane 102. For example, in FIG. 1B, the resource management card 140 manages the electrical power consumption of the line cards 120a and 120b and the processor cards 130a and 130b. The resource management card 140 sends commands via the resource management connectors 170 to adjust the electrical power consumption of the 120a and 120b and the processor cards 130a and 130b, which are connected to the resource management connectors 170. As mentioned above, in other implementations, the resource management card 140 may manage access to other shared resources such as an external status display or environmental controls.

Although FIGS. 1A and 1B show two line cards (i.e. line cards 120a and 120b), two processor cards (i.e. processor cards 130a and 130b), and one resource management card (i.e. resource management card 140) connected to the hardware plane 102, the configuration shown in FIGS. 1A and 1B is provided only as an example. Various combinations and any suitable number of line cards, processor cards, resource management cards, and/or other types of hardware cards may be used with the hardware plane 102.

Figure 2A:
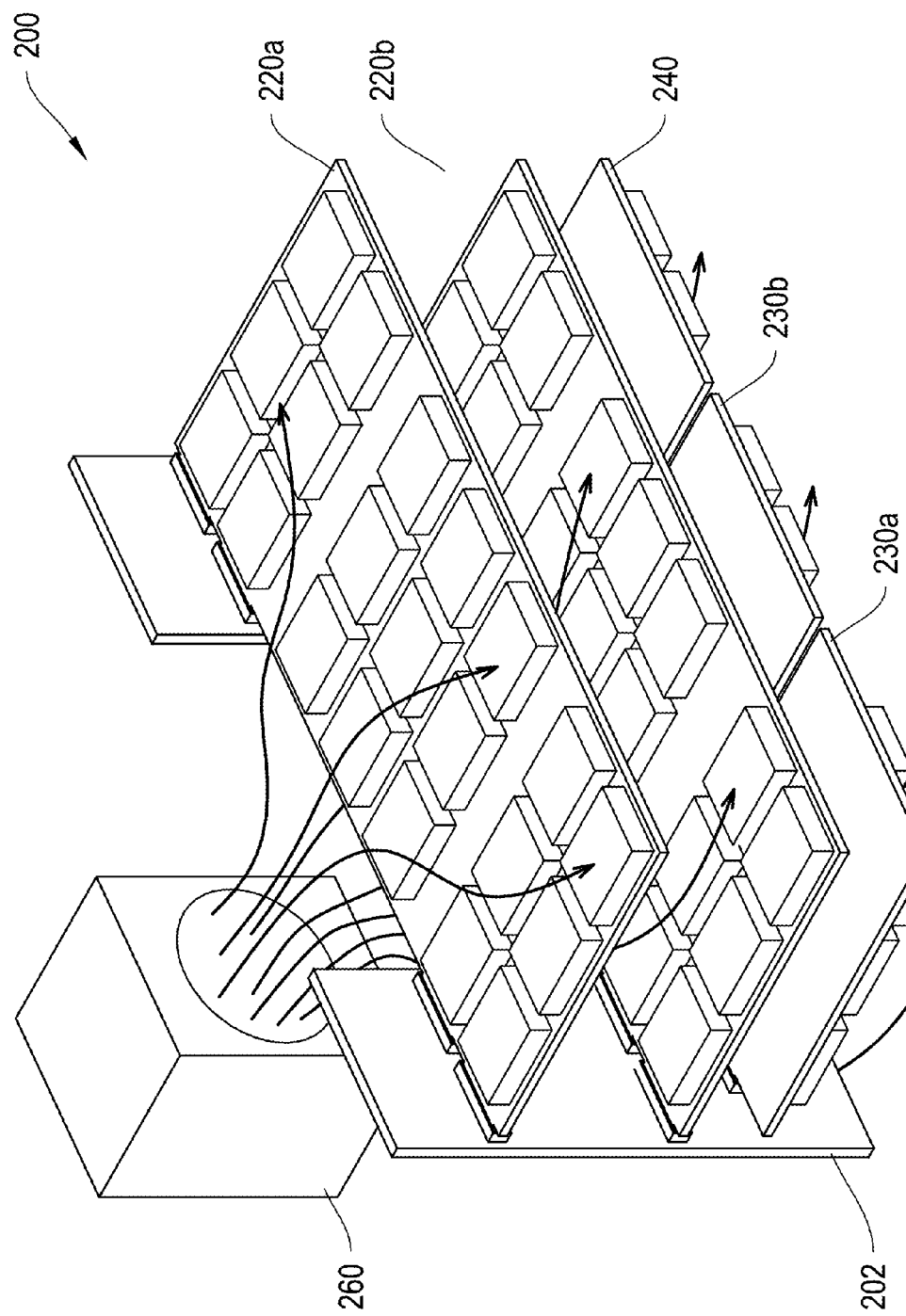
FIG. 2A is an isometric view of the operation of a cooling device in conjunction with an illustrative hardware plane in accordance with some implementations of the present disclosure.
Figure 2B:
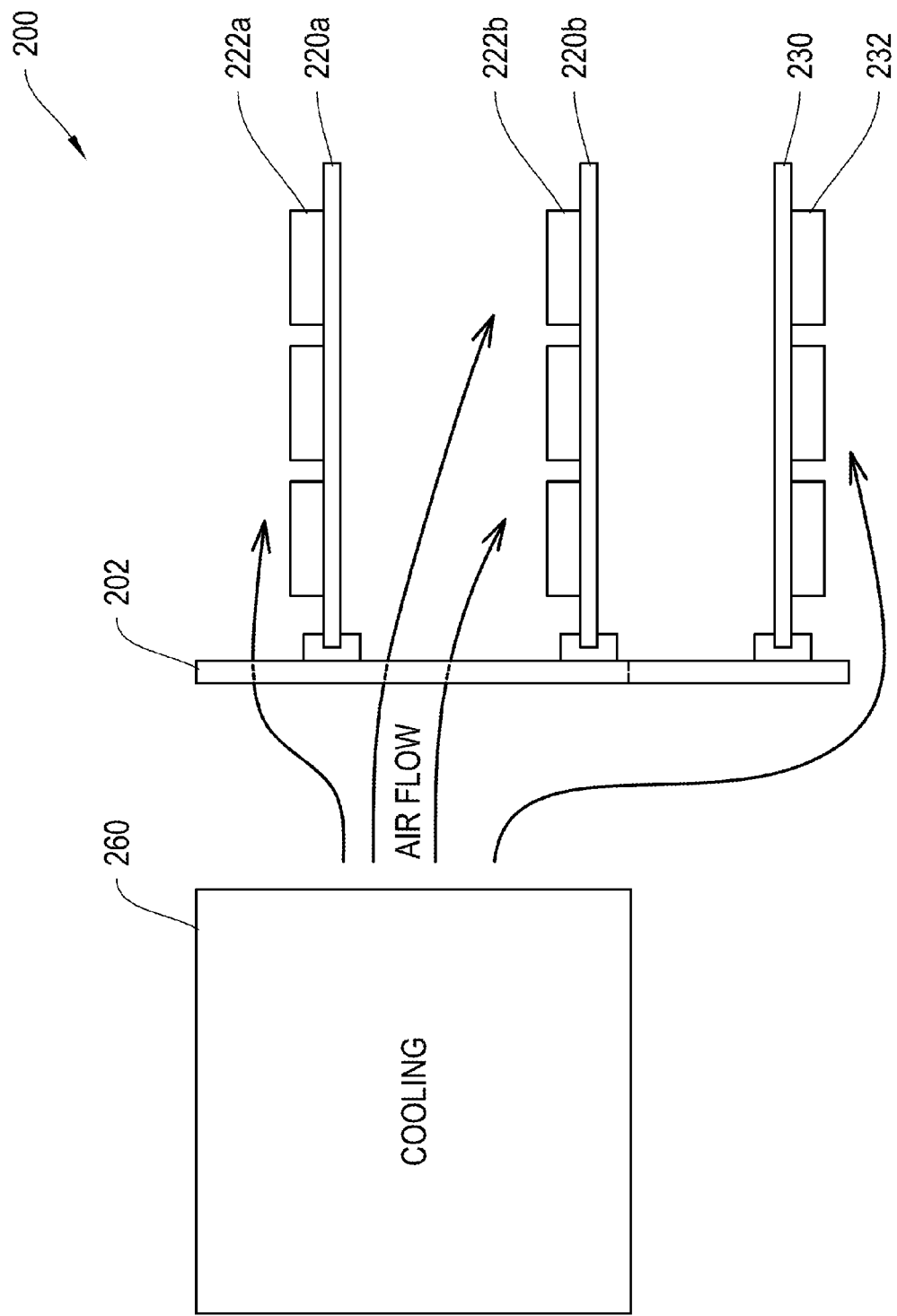
FIG. 2B is a side view of the operation of the cooling device of FIG. 2A in conjunction with the hardware plane of FIG. 2A in accordance with some implementations of the present disclosure.

FIG. 2A is an isometric view of the operation of a cooling device in conjunction with an illustrative hardware plane in accordance with some implementations of the present disclosure. FIG. 2B is a side view of the operation of the cooling device of FIG. 2A in conjunction with the hardware plane of FIG. 2A in accordance with some implementations of the present disclosure. A system 200 may be similar in form and function to the system 100 of FIGS. 1A and 1B. For example, the system 200 may be part of a server, router, network switch, or other suitable computer system.

The system 200 includes a hardware plane 202 and a cooling unit 260. The hardware plane 202 may be similar in form and function to the hardware plane 102 of FIGS. 1A and 1B. The hardware plane 202 is connected to line cards 220a and 220b, a processor card 230, and a resource management card 240.

The line cards 220a and 220b include hardware components, such as components 222a and 222b, on one surface of each of the line cards 220a and 220b. For example, the components 222a and 222b may be surface-mounted or through-hole-mounted. The processor card 230 and the resource management card 240 also include hardware components such as a component 232. The components 222a, 222b, and 232 may be any suitable hardware component such as processors, transistors, capacitors, light emitting diodes (LEDs), and other devices. As shown in FIG. 2A, the line cards 220a and 220b are connected to the minor planes of the hardware plane 202 so that the hardware components of the line cards 220a and 220b are mounted on the top surfaces of each of the line cards 220a and 220b, i.e. facing up, in a direction against gravity. As also shown in FIG. 2A, the processor card 230 and the resource management card 240 are connected to the major plane of the hardware plane 202 so that the hardware components of the processor card 230 and the resource management card 240 are mounted on the bottom surfaces of the processor card 230 and the resource management card 240, i.e. facing down, in the opposite direction of the hardware components of the line cards 220a and 220b.

One reason for positioning the processor card 230 and the resource management card 240 so that their surface-mounted components are face down is to allow air from the cooling unit to flow underneath the bottom edge of the hardware plane 202 and across the surface-mounted components of the processor card 230 and the resource management card 240. There is much more air flow underneath the bottom edge of the hardware plane 202 than over the top edge of the major plane (i.e. the base) of the hardware plane 202 because the major plane tends to impede air flow. Another reason for positioning the processor card 230 and the resource management card 240 as shown is that this configuration increases the density, and thus the packing efficiency, of hardware cards because the configuration connects two rows of hardware cards to the major plane of the hardware plane 202 while allowing the cooling unit 260 to effectively cool both rows.

In some implementations, the hardware plane 202 may be positioned in a server or hardware rack along with many other hardware planes in a data center. A cooling unit may be used to cool multiple hardware planes in nearby racks instead of just cooling a single hardware plane. In some implementations, the hardware plane 202 may be part of a blade-based electronics chassis.

The various components of the system 200 generate heat during operation. The cooling unit 260 may remove the built-up heat by moving air through the system 200. The cooling unit 260 may be a fan or other type of air-flow-creating device. As seen in FIG. 2, the cooling unit 260 moves air through the gap between the minor planes of the hardware plane 202 and substantially orthogonally to the surface of the hardware plane 202. Because the line cards 220a and 220b are connected to the hardware plane 202 so that their edges span the gap, neither the hardware plane 202 nor the line cards 220a and 220b block the air flow created by the cooling unit 260. The air flows across the surface-mounted components of the line cards 220a and 220b to cool the line cards 220a and 220b. In addition, the air flows underneath the bottom edge of the hardware plane 202 and across the surface mounted components of the processor card 230 and the resource management card 240 to cool the processor card 230 and the resource management card 240. The cooling unit 260 may move air, for example, by any suitable mechanism, such as by blowing or pulling air via fan blades.

The configuration of the hardware plane 202 shown in FIGS. 2A and 2B is provided only as an example. For example, the cooling unit 260 may be positioned on the other side of the hardware plane 202 so that the air flow travels in a direction roughly opposite to the direction depicted in FIG. 2B. Also, the cooling unit 260 may move air towards the cooling unit 260 instead of moving air away from the cooling unit 260 as depicted in FIG. 2B. The hardware plane 202 may be installed upside-down in relation to the orientation shown in FIG. 2B, i.e. with the major plane at the top and the minor planes on the bottom and with the air flow moving back to front or front to back. The hardware plane 202 may also be installed in an orientation that is rotated 90 degrees about the bottom edge of the hardware plane 202 from the position depicted in FIG. 2B, i.e. with the surface of the hardware plane 202 parallel to the ground and the cooling unit mounted either above or below the hardware plane 202 so that the air flow moves up or down through the gap. Other configurations are also possible without departing from the principles of the present disclosure.

Figure 3A:
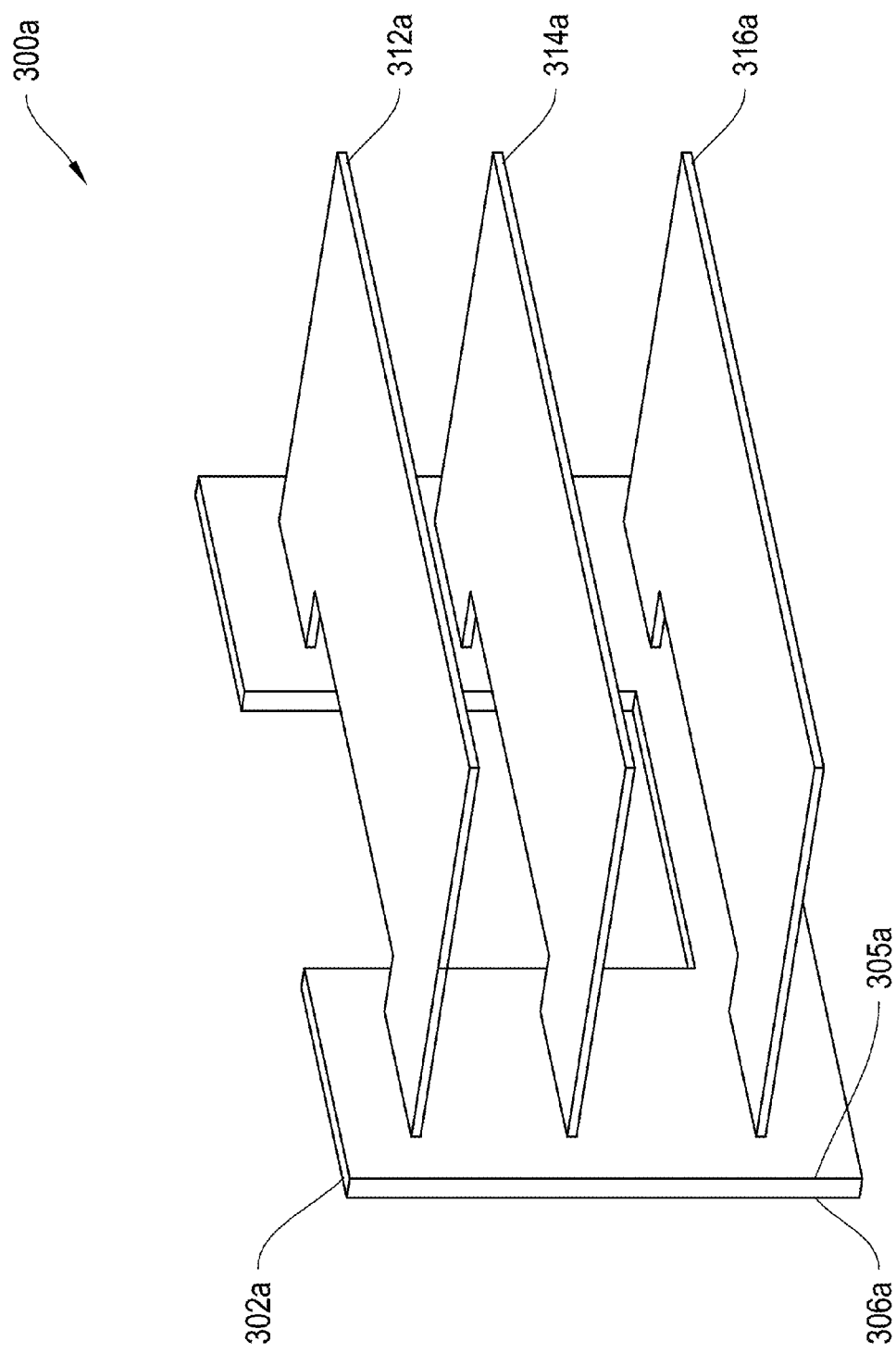
FIG. 3A shows an illustrative hardware plane configured as a backplane in accordance with some implementations of the present disclosure.

FIG. 3A shows an illustrative hardware plane configured as a backplane in accordance with some implementations of the present disclosure. A system 300a includes a hardware plane 302a configured as a backplane connected to hardware cards 312a, 314a, and 316a. The hardware cards 312a, 314a, and 316a may be line cards, processor cards, resource management cards, or any other suitable type of hardware peripheral. The hardware plane 302a has two major surfaces, a surface 305a and a surface 306a. In a backplane configuration, the hardware plane 302a interconnects hardware cards connected to only one major surface, e.g. the surface 305a.

Figure 3B:
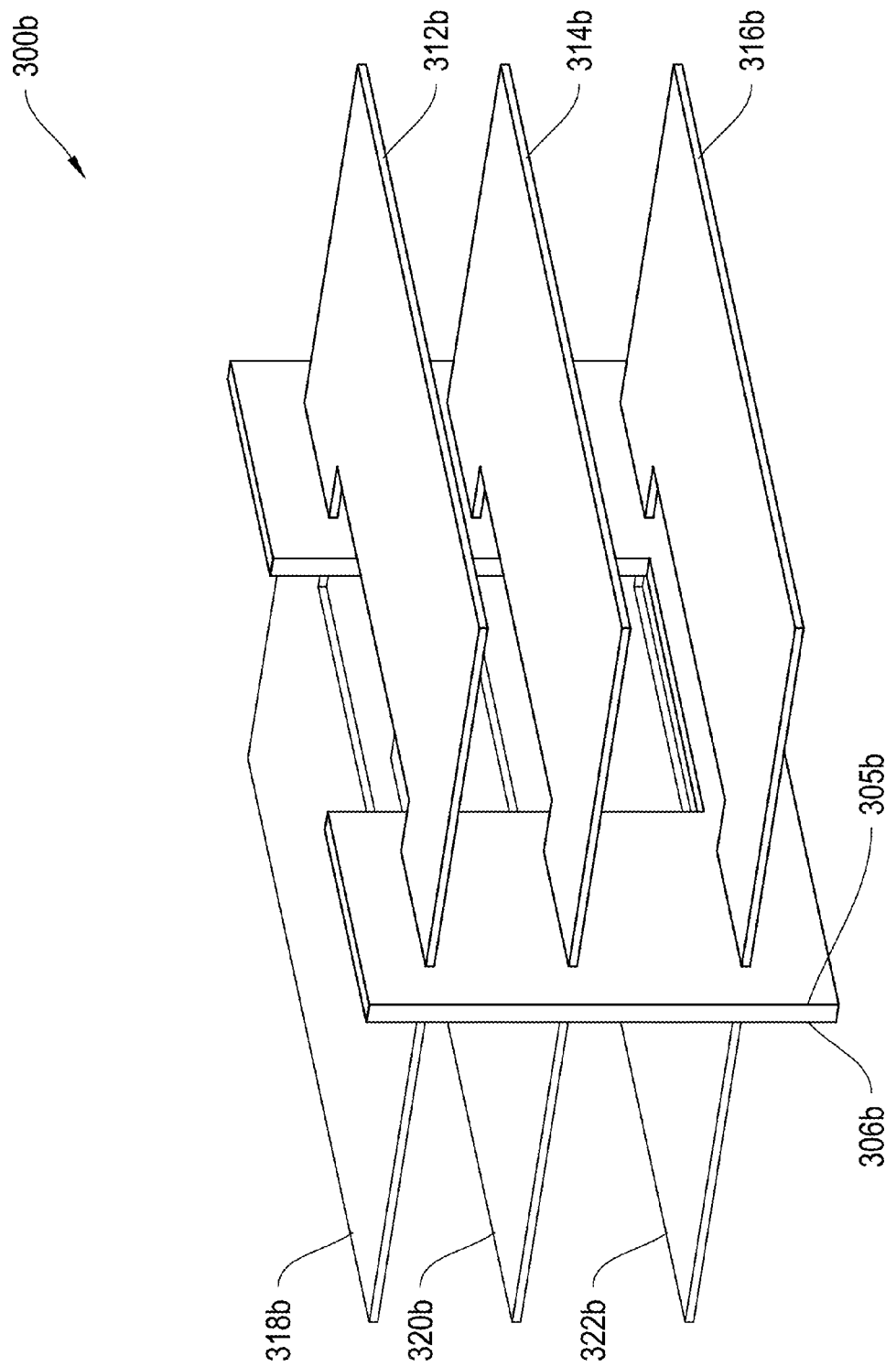
FIG. 3B shows an illustrative hardware plane configured as a midplane in accordance with some implementations of the present disclosure.

FIG. 3B shows an illustrative hardware plane configured as a midplane in accordance with some implementations of the present disclosure. A system 300b includes a hardware plane 302b configured as a midplane connected to hardware cards 312b, 314b, 316b, 318b, 320b, and 322b. The hardware plane 302b has two major surfaces, a surface 305b and a surface 306b. In a midplane configuration, hardware cards may be connected to both major surfaces of the hardware plane 302b. For example, the hardware cards 318b, 320b and 322b are connected to the surface 306b while hardware cards 312b, 314b, and 316b are connected to the surface 305b. As mentioned previously, the hardware cards may be line cards, processor cards, resource management cards, or any other suitable type of hardware peripheral. The hardware cards may include surface-mounted or through-hole-mounted hardware components. The hardware plane 302 may include connectors on both of its surfaces to allow for hardware cards to connect to both surfaces. A midplane design may allow for physical separation of different types of hardware cards. For example, in some implementations, the hardware cards connected to one major surface (e.g. hardware cards 312b, 314b, and 316b) may be processor cards and/or resource management cards, and the hardware cards connected to the second major surface (e.g. hardware cards 318b, 320b, and 322b) may be networking line cards.

In some implementations, the hardware cards 322b and 316b (i.e. the bottom row of hardware cards) may have their surface-mounted components facing down, i.e. away from the minor planes of the hardware plane 302b. The hardware cards 312b, 314b, 318b, and 320b may have their surface-mounted components facing the opposite direction from the surface-mounted components of the hardware cards 322b and 316b.

Figure 3C:
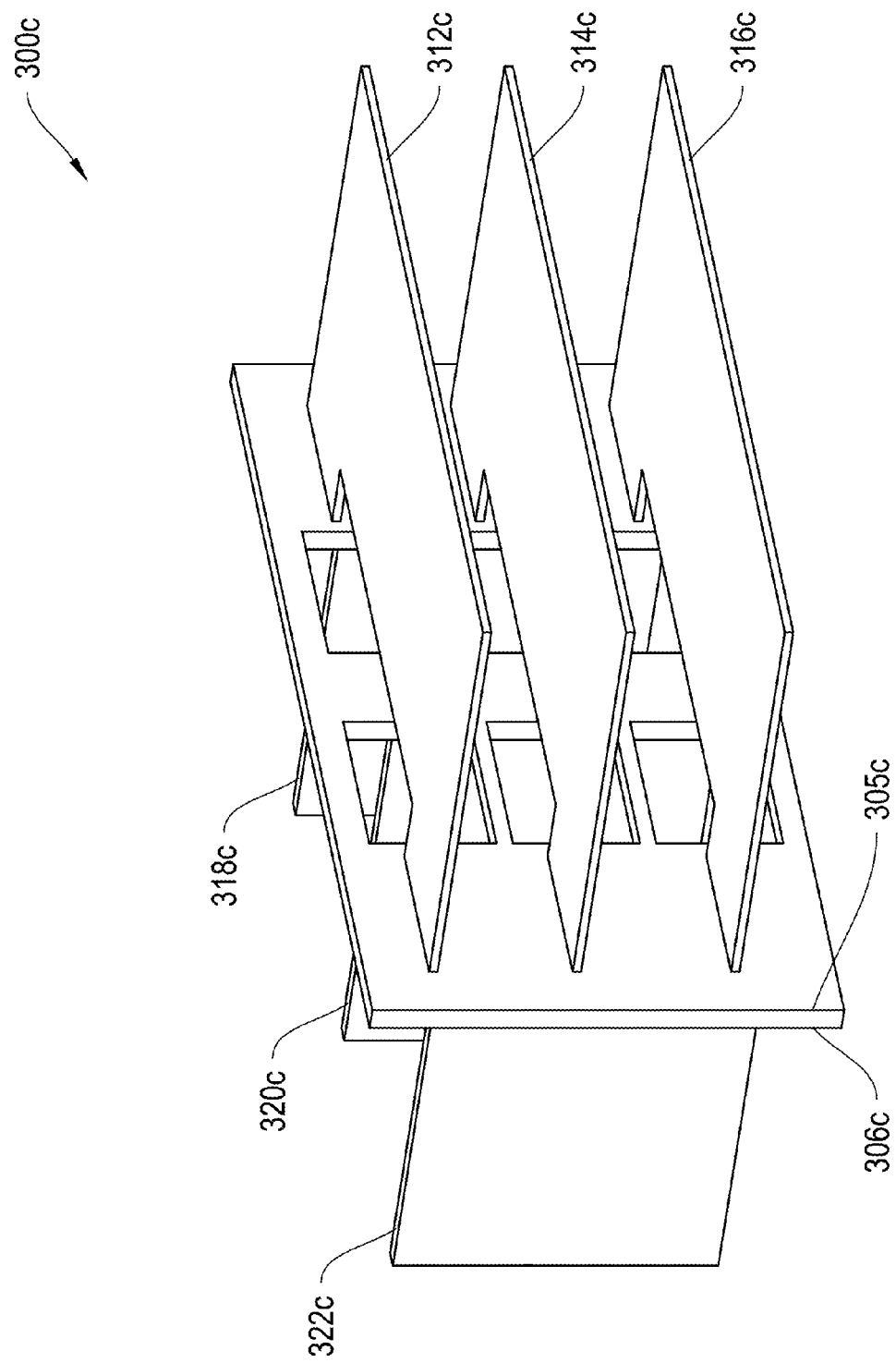
FIG. 3C shows another illustrative hardware plane configured as a midplane in accordance with some implementations of the present disclosure.

FIG. 3C shows another illustrative hardware plane configured as a midplane in accordance with some implementations of the present disclosure. A system 300c includes a hardware plane 302c configured as a midplane connected to hardware cards 312c, 314c, 316c, 318c, 320c, and 322c. As shown in FIG. 3C, the hardware cards 318c, 320c, and 322c may be connected to the hardware plane 302c so that they are rotated ninety degrees from the orientation of the hardware cards 318b, 320b, and 322b of FIG. 3B. The hardware plane 302c may contain several rectangular air gaps as depicted.

FIGS. 4A-4F show several illustrative hardware planes containing exemplary geometries in accordance with some implementations of the present disclosure. Although the disclosure so far has described mostly hardware planes with two minor planes and a substantially rectangular major plane, many other geometric configurations are possible.

Figure 4A:
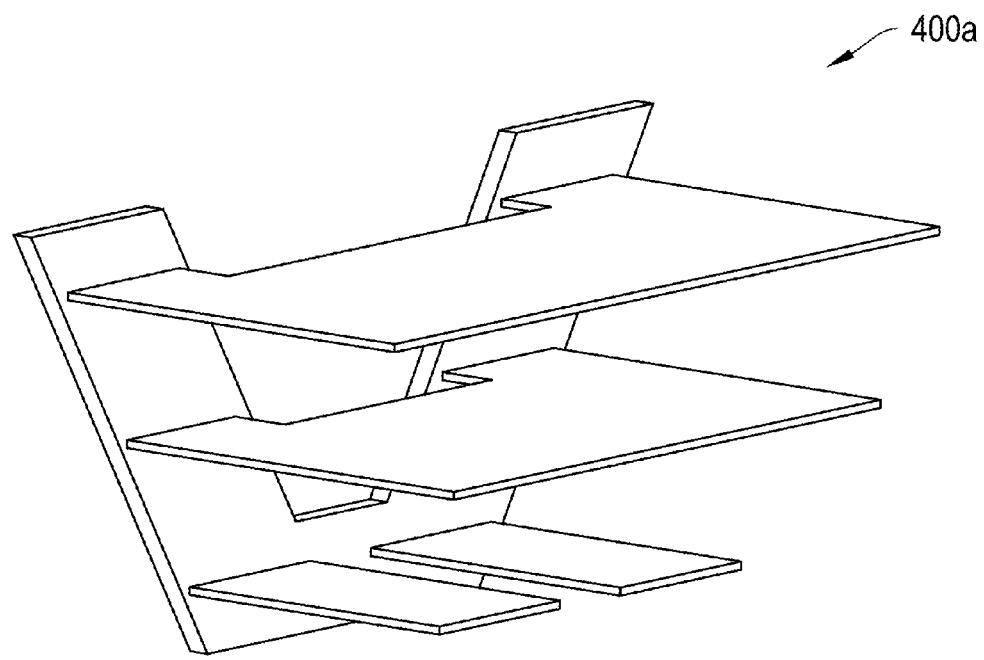
FIGS. 4A-4F show several illustrative hardware planes having exemplary geometries in accordance with some implementations of the present disclosure.
Figure 4B:
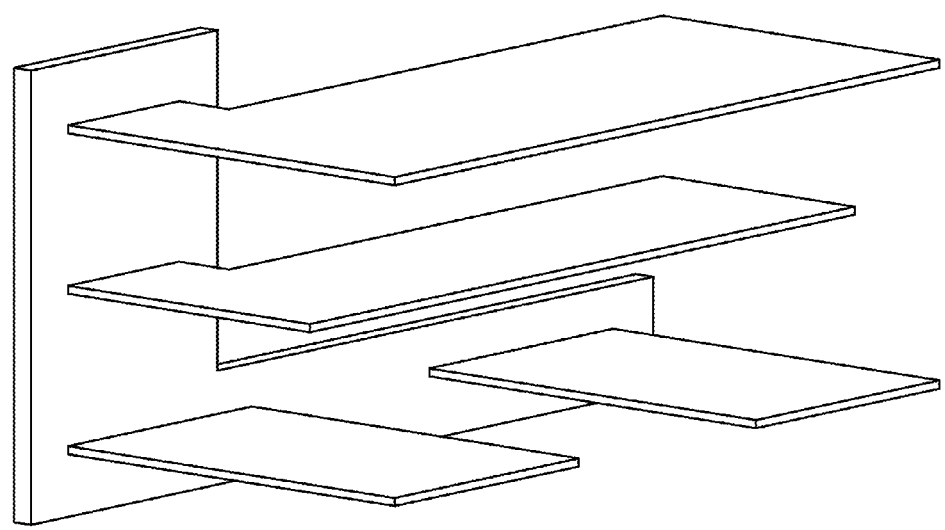
Figure 4C:
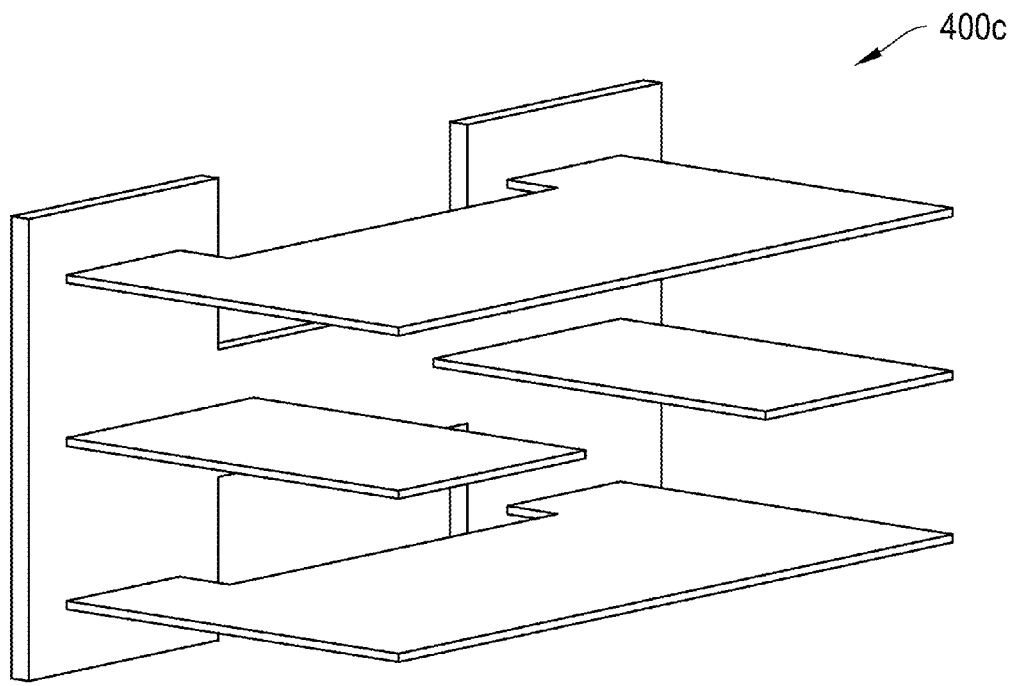
Figure 4D:
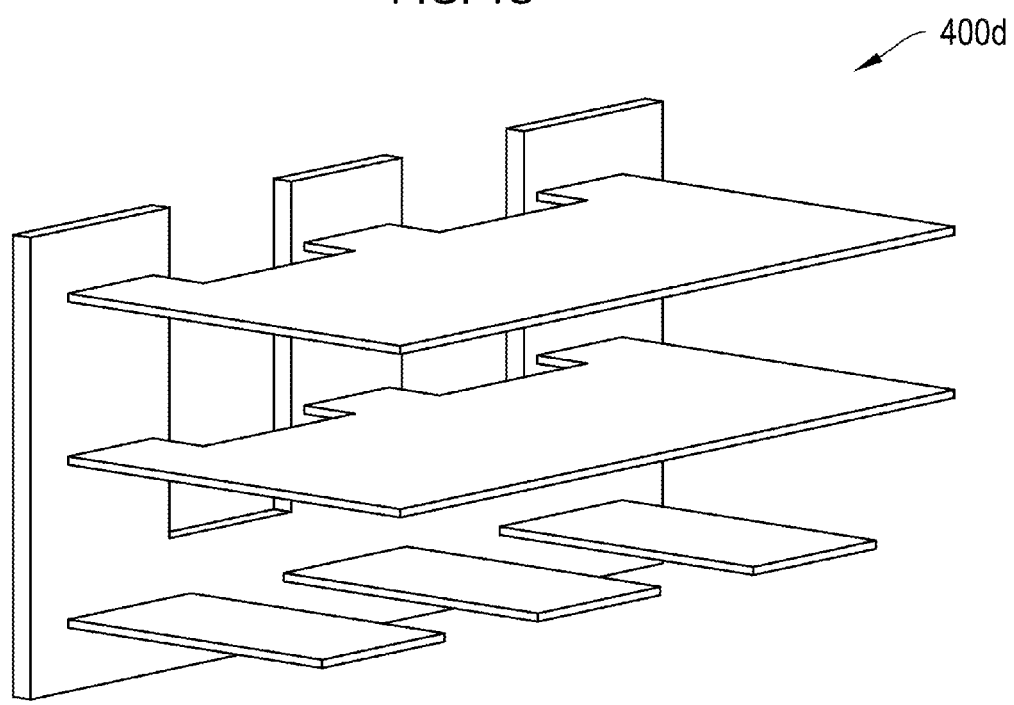
Figure 4E:
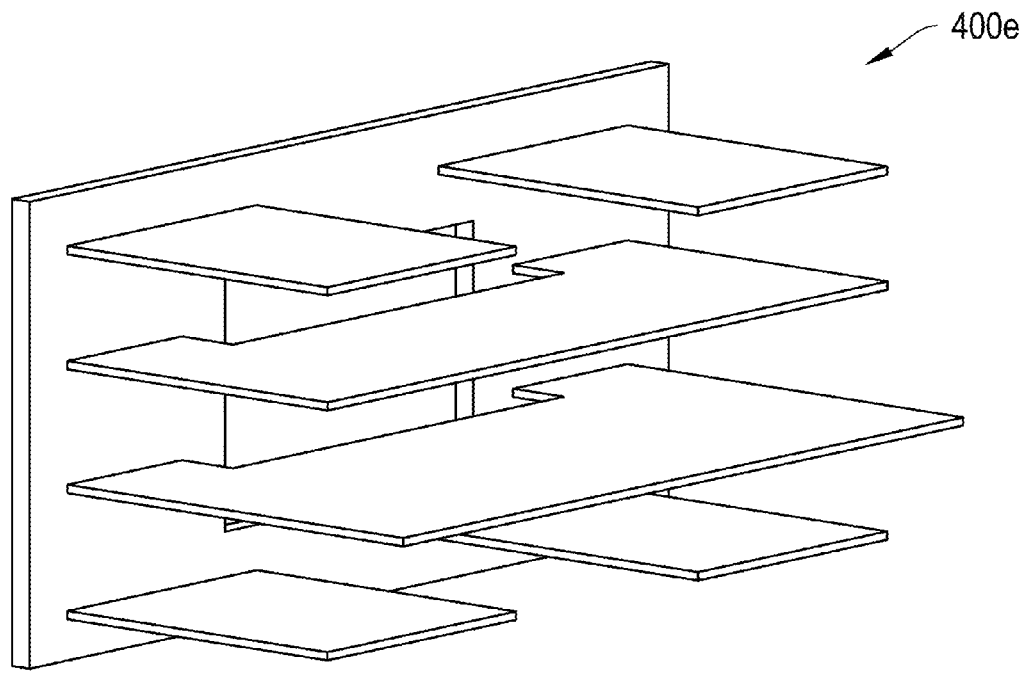
Figure 4F:
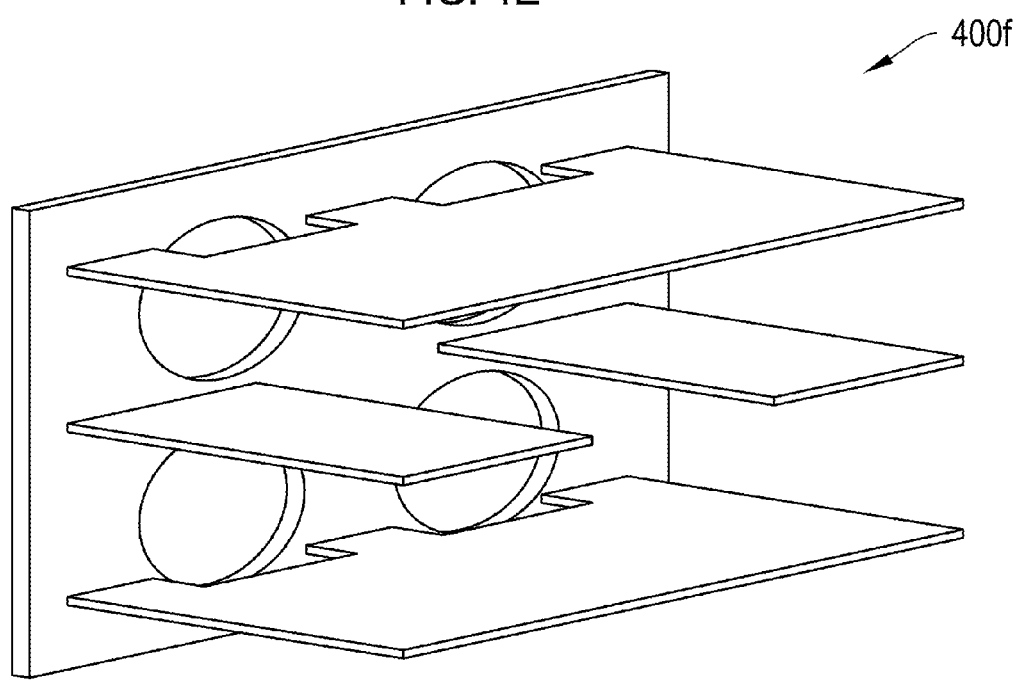

FIG. 4A shows a hardware plane 400a with two minor planes and a major plane. The minor planes extend outwards from an edge of the major plane at an oblique angle rather than a right angle. In other implementations, the minor planes may be connected at other angles, e.g. angling inwards.

A hardware plane may have fewer than two minor planes. For example, in FIG. 4B, a hardware plane 400b has only one minor plane and a major plane. In some implementations, the minor plane may extend from the middle of an edge of the major plane. A hardware plane may also have more than two minor planes. For example, in FIG. 4D, a hardware plane 400d has three minor planes and a major plane.

A hardware plane may not have all of its minor planes extending in the same direction. For example, in FIG. 4C, a hardware plane 400c has four minor planes and a central major plane. Two minor planes may extend orthogonally from an edge of the central major plane while the other two minor planes extend orthogonally from an opposite edge of the central major plane. As a result, the hardware plane 400c has two gaps or openings formed by its two pairs of minor planes.

A hardware plane may have an internal gap or opening instead of minor planes to allow for improved air flow. For example, in FIG. 4E, a hardware plane 400e has an internal opening bordered on the top by a top horizontal portion, on the bottom by a bottom horizontal portion, and on the sides by right and left vertical portions. The hardware plane 400e may have a control bus running across each horizontal portion and a data bus running across each vertical portion. A hardware plane may also have multiple internal openings. For example, in FIG. 4F, a hardware plane 400f has four internal openings. The openings may have different shapes and have different sizes. The hardware plane 400f may include data buses and control buses positioned along a surface. The hardware plane 400f may also include connectors positioned along the surface to connect hardware cards orthogonally to the surface.

In some implementations, a hardware backplane may be replaced by a system of cables and connectors in retention brackets. The retention brackets may physically hold hardware cards in place, and the cables may form the data buses and control buses necessary for the hardware cards to communicate. The space between the cables, brackets, and connectors may allow for improved air flow to the hardware cards.

The hardware planes shown in FIGS. 4A-4F are provided only as examples. A hardware plane may have other geometric configurations without departing from the principles of the present disclosure. For example, any hardware plane that provides for at least one control bus, at least one data bus, and a gap or opening that allows for more air flow is within the scope of the present disclosure.

The various implementations of hardware planes discussed above may provide several advantages. One possible advantage is that a hardware plane as discussed above may use space more efficiently in order to improve air flow. Areas in the hardware plane that do not contain data buses, control buses, or components may be removed to create air passages for improved air flow. As seen in FIG. 1A, for example, the area between the minor plane 110a and minor plane 110b was removed to create a gap for improved air flow. A second possible advantage is that a hardware plane as discussed above may be cheaper and more efficient to manufacture due to the gaps or openings present in the design, resulting in more efficient panel usage during PCB manufacturing. In addition, the hardware plane may maintain better dimensional control between its connector blocks than if the hardware plane were split into two assemblies. A third possible advantage is that a hardware plane as discussed above may be modular and flexible. For example, one or more hardware planes, such as the example hardware planes shown in FIGS. 1A, 1B, and 4A-4F, may be used to construct various systems to meet different technical and structural requirements, such as a minimum number of data buses, a maximum height, or a maximum length.

While various implementations have been shown and described herein, it will be obvious to those skilled in the art that such implementations are provided by way of example only. Numerous variations, changes, and substitutions will now occur to those skilled in the art without departing from the present disclosure. It should be understood that various alternatives to the implementations described herein may be employed. It is intended that the following claims define the scope of the present disclosure and that methods and structures within the scope of these claims and their equivalents be covered thereby.

What is claimed is:

1. A hardware plane providing improved airflow, the hardware plane comprising:
   a substantially rectangular major plane comprising a control bus to communicate with a plurality of hardware cards;
   a first substantially rectangular minor plane extending from a first edge of the major plane, the first minor plane comprising a data bus to communicate with the plurality of hardware cards;
   a first connector positioned on a first surface of the hardware plane, the first connector to connect a first hardware card of the plurality of hardware cards orthogonally to the first surface of the hardware plane; and
   a second substantially rectangular minor plane extending from the first edge of the major plane wherein a gap separates the first minor plane and the second minor plane.

2. The hardware plane of claim 1, wherein the major plane, the first minor plane, and the second minor plane are substantially coplanar.

3. The hardware plane of claim 1, comprising:
a second connector positioned on the first surface of the hardware plane, the second connector to connect a second hardware card of a plurality of hardware cards orthogonally to the first surface of the hardware plane.

4. A system comprising the hardware plane of claim 3, the system further comprising a cooling device to produce air flowing substantially orthogonally to the first surface of the plane through the gap and across the plurality of hardware cards.

5. The hardware plane of claim 3, wherein:
the first hardware card and the second hardware card each comprise a first surface comprising hardware components, and
when the first hardware card and the second hardware card are each connected to the hardware plane, the first surface of the first hardware card and the first surface of the second hardware card face opposite directions.

6. The hardware plane of claim 5, wherein:
the first connector is positioned on the first minor plane, the first connector to connect the first hardware card orthogonally to the first minor plane, and
the second connector is positioned on the major plane, the second connector to connect the second hardware card orthogonally to the major plane.

7. The hardware plane of claim 6, wherein the first hardware card comprises a line card connected to the data bus and the control bus, the line card to provide access to a telecommunications network.

8. The hardware plane of claim 6, wherein the second hardware card comprises a processor card connected to the control bus, the processor card comprising a processor to process data received from the plurality of hardware cards and control the behavior of the plurality of hardware cards.

9. The hardware plane of claim 3, wherein the second hardware card comprises a resource management card connected to the control bus, the resource management card to manage access to a shared resource by the plurality of hardware cards.

10. The hardware plane of claim 9, wherein the resource management card manages the power consumption of the hardware plane and the plurality of hardware cards.

11. The hardware plane of claim 1, comprising:
a second connector positioned on a second surface of the hardware plane opposite to the first surface of the hardware plane, the second connector to connect a second hardware card of the plurality of hardware cards orthogonally to the second surface of the hardware plane.

12. The hardware plane of claim 11, comprising:
a third connector positioned on the first surface of the hardware plane, the third connector to connect a third hardware card of the plurality of hardware cards orthogonally to a first surface of the hardware plane.

13. The hardware plane of claim 12, wherein:
the first hardware card and the third hardware card each comprise a first surface comprising hardware components, and
when the first hardware card and the third hardware card are each connected to the hardware plane, the first surface of the first hardware card and the first surface of the third hardware card face opposite directions.

14. A hardware plane, providing improved airflow, the hardware plane comprising:
a substantially rectangular major plane comprising one or more openings to allow air to pass through substantially orthogonally to a first surface of the major plane, wherein the one or more openings are completely surrounded by the major plane;
a control bus positioned along the first surface of the major plane, the control bus to communicate with a plurality of hardware cards;
a data bus positioned along the first surface of the major plane, the data bus to communicate with a plurality of hardware cards; and
a connector positioned on the first surface of the major plane, the connector to connect a first hardware card of the plurality of hardware cards orthogonally to the first surface of the major plane.

* * * * *